(12) United States Patent
Howlett et al.

(10) Patent No.: US 9,872,103 B2
(45) Date of Patent: *Jan. 16, 2018

(54) MICROPHONE BIASING CIRCUITRY AND METHOD THEREOF

(71) Applicant: Cirrus Logic International Semiconductor Ltd., Edinburgh (GB)

(72) Inventors: Andrew James Howlett, Edinburgh (GB); Graeme Gordon Mackay, Dunfermline (GB); Douglas James Wallace MacFarlane, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/591,808

(22) Filed: May 10, 2017

(65) Prior Publication Data

US 2017/0245052 A1    Aug. 24, 2017

Related U.S. Application Data

(63) Continuation of application No. 15/342,232, filed on Nov. 3, 2016, now Pat. No. 9,661,434, which is a
(Continued)

(30) Foreign Application Priority Data

Apr. 11, 2013    (GB) .................................. 1306633.7

(51) Int. Cl.
   *H04R 3/00*    (2006.01)
   *H04R 29/00*   (2006.01)
   *H03F 3/183*   (2006.01)

(52) U.S. Cl.
   CPC ............... *H04R 3/00* (2013.01); *H03F 3/183* (2013.01); *H04R 29/004* (2013.01);
   (Continued)

(58) Field of Classification Search
   CPC .... H04R 29/00; H04R 29/004; H04R 29/001; H04R 3/00; H04R 2499/11;
   (Continued)

(56) References Cited

U.S. PATENT DOCUMENTS

| 8,861,765 B2 * | 10/2014 | Buck | H04R 3/007 381/111 |
| 2008/0219483 A1 * | 9/2008 | Klein | H04R 3/005 381/174 |

(Continued)

FOREIGN PATENT DOCUMENTS

EP    2704450 A1    5/2014

OTHER PUBLICATIONS

Examination Report under Section 18(3), GB Patent Application No. GB1306633.7, dated Jun. 16, 2015, 3 pages.

*Primary Examiner* — Mark Blouin
(74) *Attorney, Agent, or Firm* — Jackson Walker L.L.P.

(57) ABSTRACT

A host device for use with a removable peripheral apparatus having a microphone, and to the biasing circuitry for said microphone. The host device may have a device connector for forming a mating connection with a respective peripheral connector. A source of bias is arranged to supply an electrical bias to a device microphone contact of the device connector via a biasing path. A capacitor is connected between a reference voltage node and a capacitor node of the biasing path. A first switch is located between the capacitor node and the device microphone contact. Detection circuitry detects disconnection of the peripheral connector and device connector; and control circuitry controls the switch to disable the biasing path.

20 Claims, 10 Drawing Sheets

Related U.S. Application Data continuation of application No. 14/864,619, filed on Sep. 24, 2015, now Pat. No. 9,490,765, which is a continuation of application No. 14/244,075, filed on Apr. 3, 2014, now Pat. No. 9,148,722.

(52) U.S. Cl.
CPC ...... *H03F 2200/03* (2013.01); *H04R 2420/03* (2013.01); *H04R 2420/05* (2013.01)

(58) Field of Classification Search
CPC .. H04R 2420/07; H04R 29/005; H04R 3/005; H04R 2201/003
USPC .......................................................... 381/58
See application file for complete search history.

(56) References Cited

U.S. PATENT DOCUMENTS

2012/0201401 A1* 8/2012 Kim .................... H04R 29/004
 381/122
2012/0308041 A1 12/2012 Birch et al.

\* cited by examiner

MICROPHONE BIASING CIRCUITRY AND METHOD THEREOF

The present disclosure claims priority as a continuation to U.S. patent application Ser. No. 15/342,232 filed Nov. 3, 2016, issuing May 23, 2017 as U.S. Pat. No. 9,661,434, which is a continuation of U.S. patent application Ser. No. 14/864,619, filed Sep. 24, 2015, issued as U.S. Pat. No. 9,490,765 on Nov. 8, 2016, which is a continuation of U.S. patent application Ser. No. 14/244,075 filed Apr. 3, 2014, issued as U.S. Pat. No. 9,148,722 on Sep. 29, 2015, which claims priority to United Kingdom Patent Application Serial No. 1306633.7, filed Apr. 11, 2013, all of which are incorporated by reference herein in their entirety.

BACKGROUND OF THE INVENTION

1. Field of the Invention

This invention relates to microphone biasing circuitry and methods for reducing or removing unwanted bias on a microphone contact of a connector (for connecting to an external microphone) as a removable peripheral apparatus is removed.

2. Description of the Related Art

Many contemporary electronic devices have the facility to connect with peripheral audio devices. For instance, mobile telephones, tablets, laptop computers and the like are examples of electronic devices that are operable with peripheral audio devices such as a headset, for example, that is external to and distinct from the electronic device. Headsets typically comprise mono or stereo speakers for audio playback and a microphone for voice communication.

Such external peripheral audio devices are often connected via a mating connector such as a plug and socket arrangement. For instance, many headsets have a 3.5 mm jack plug for connection to a suitable jack socket on the host electronic device. A well-known arrangement for a jack plug and its associated socket is TRRS (Tip-Ring-Ring-Sleeve), which has four contacts for left audio, right audio, microphone, and ground. In one known arrangement, the tip (T) and first ring (R1) are used for left (L) and right (R) audio, for example left and right loudspeakers, with the second ring (R2) and sleeve (S) used for the microphone (M) and ground (G) respectively. It will be appreciated that different arrangements for the left and right audio, microphone, and ground contacts are also possible.

In use a microphone bias is supplied by the host device to the microphone (M) contact of the socket so that when a plug (which is connected to a headset with an external microphone) is plugged into the compatible socket the external microphone is suitably biased and is ready for use.

Using the well-known arrangement described above as an example for illustrating the problem, as the plug is removed from a socket some of the contacts (T, R1, R2, S) on the plug will be moved past and make contact with other various and different contacts (T, R1, R2, S) of the socket. This can lead to undesired effects if there is still a voltage present on a socket contact. For example, when the plug is removed from the socket the tip contact T and first ring contact R1 of the plug, which are connected to the speakers (L, R) of the peripheral apparatus, will make contact with the socket contact R2 contact used to provide bias for the external microphone. If there is still a bias present at this socket contact R2 then this unwanted bias causes the speakers to operate in an undesirable fashion, e.g. to output an audible artefact such as a pop or click sound.

FIGS. 1a and 1b illustrate this effect. FIG. 1a shows a jack plug 110 fully inserted into a jack socket. The jack socket comprises contact pins 113, 115, 117, 119 serving as contacts T, R1, R2 and S of the socket respectively. (The remainder of the socket mechanical structure is omitted for clarity). The jack plug has four contact areas, 112, 114, 116 and 118 serving as contacts T, R1, R2, S of the plug respectively. In this example these plug contacts may be connected to a first (e.g. left) speaker L, a second (e.g. right) speaker R, microphone M, and common ground return path G respectively as shown in FIG. 1c which illustrates the connections in the removable peripheral apparatus. However the configuration of the socket contacts and the plug contacts may differ.

FIG. 1a shows the jack plug as being fully inserted into the socket with each plug contact making contact with the correspondingly correct socket contact (and only that socket contact). Circuitry may be connected to the four contacts of the socket consistent with this connection, for instance microphone bias and amplifier circuitry connected to the socket R2 contact, a ground connection to the socket S contact, and right- and left-channel speaker driver amplifiers to the socket R1 and T contacts.

The socket may also comprise some circuitry, for instance a normally-open switch 111 which is closed when the jack plug is fully inserted, to allow generation of a jack-insert detection signal, for instance by means of an external pull-up resistor connected to one pole of the switch, to indicate whether there is a plug fully inserted into the socket or not.

FIG. 1b shows the plug having been partially removed. In this state the plug sleeve (plug S contact 118) connected to the common ground return G has been completely disconnected from the socket. The plug R2 contact 116, connected to the microphone, is now in contact with the socket S contact 119, which is grounded. The plug R1 contact 114, connected to the second speaker (R), is now in contact with the socket R2 contact 117, itself connected to the microphone bias circuitry. Therefore there will be a bias on the socket R2 contact 117, and such bias will cause current to flow from this contact, through the second speaker R and microphone M to ground via socket S contact 119.

Furthermore when the jack plug is pulled out further the plug T contact 112 connected to first speaker L will (at least briefly) make contact with socket R2 contact 117 connected to the microphone bias, and the plug R1 contact 114 connected to second speaker R will make contact with socket R2 contact 117 connected to the microphone bias. Thus it can be seen that removing the plug will result in the microphone bias being temporarily applied to both the left (L) and right (R) audio speaker contacts (T, S1) on the plug which will result in current passing through both speakers via their common connection, which may result in an unwanted sound, i.e. an unwanted audio artefact.

In both FIGS. 1a and 1b is illustrated a typical configuration of microphone biasing circuitry. In this example microphone biasing circuitry 102 such as a buffer amplifier outputs, via resistor 121, a bias for the external microphone. The microphone output, typically a JFET source follower with gate coupled to a capacitive electret (or MEMS) acoustic transducer, superimposes an AC signal on the d.c. bias provided. The input circuitry 103 buffers and amplifies the AC signal produced by the microphone in use. The DC blocking capacitor 124 allows the audio signal from the microphone to pass though to the input amplifier, but blocks the quiescent d.c. level of the microphone output from the d.c. bias of the input amplifier to allow the latter to be set independently at a convenient level, typically half the supply voltage.

Shown in FIG. 2 is another known configuration for biasing a microphone of a removable peripheral apparatus. For simplicity, the connector arrangement, e.g. plug and socket is omitted. The biasing circuitry will, in use, be connected to a suitable contact on a device connector, such as a microphone socket contact, i.e. a socket contact to which a microphone is anticipated to be connected via a corresponding microphone jack plug contact. These contacts may correspond to the R2 contacts 117 and 116 in the example of FIGS. 1a and 1b, but as noted could be other contacts in other examples.

The microphone biasing circuitry 102, generating the bias for the external microphone, connects to the microphone (M) socket contact 117 (R2) via two series connected resistors 222 and 223. Between the two resistors 222, 223 there is a capacitor node to which the first plate of a capacitor 225 connects. The other plate of the capacitor 225 connects to a reference voltage node, in this case a ground node. This capacitor 225 serves as a low pass filter to remove any noise which could be picked up on the microphone bias relative to this ground node and would otherwise appear as a spurious component of the input signal. In mobile telephones for example, a significant source of noise is due to the GSM RF power amplifiers, which creates TDMA noise (time division multiple access noise) due to supply current modulation appearing on the ground return paths for example at a frequency of 217 Hz. In order to prevent this noise being picked up by the microphone circuitry the capacitor 225 has to be large enough to significantly attenuate signals of a frequency of 217 Hz. This means that during operation the capacitor will store an appropriate amount of charge which will eventually have to be discharged at some point in time.

In order to at least reduce the unwanted bias at the microphone socket contact the microphone biasing circuitry 102 may be disabled, for example by removing supply power to the amplifier, as the jack plug is removed from the socket. However, the large capacitor 225 will take time to discharge, and meanwhile the charge present on the capacitor 225 will still create an unwanted bias at the microphone socket contact. This unwanted bias from capacitor 225 will then operate the first and second speakers connected to the jack plug in an undesired fashion as described above.

SUMMARY OF THE INVENTION

Embodiments of the present invention are aimed at reducing the bias at the microphone contact of the connector of the host device in response to a removable peripheral apparatus being removed from a socket.

Thus according to the present invention there is provided a host device for use with a removable peripheral apparatus having a microphone, the host device comprising: a device connector capable of forming a mating connection with a respective peripheral connector of the removable peripheral device, the device connector having a device microphone contact; a biasing path for supplying an electrical bias to said device microphone contact; a capacitor connected between a reference voltage node and a capacitor node of said biasing path; a first switch located in the biasing path between the capacitor node and the device microphone contact, said switch being operable to disable the biasing path; detection circuitry for detecting disconnection of the peripheral connector and device connector; and control circuitry for controlling said first switch to disable the biasing path in response to detection of disconnection of the peripheral connector and device connector.

The device may further comprise biasing circuitry operable to supply said electrical bias to the biasing path via a bias node.

Preferably said control circuitry is configured to operate said first switch to disable the biasing path within 100 µs of said detection of disconnection.

In some embodiments the first switch may be closed only when a microphone contact of the peripheral connector is detected to be connected to said device microphone contact.

The device may further comprise a second switch operable to connect the device microphone contact to a second reference voltage, which may substantially the same voltage as the reference voltage node. The second switch may be operable to connect the device microphone contact to the reference voltage node. In use, the voltage at the reference voltage node may be a ground voltage. The second switch may be controlled by said control circuitry, and operates to connect said device microphone contact to ground in response to the detection of disconnection.

When biasing circuitry is present the control circuitry may be configured to disable the biasing circuitry in response to said detection of disconnection.

There may additionally be input circuitry for receiving an input signal from said device microphone contact. The control circuitry may be configured to disable the input circuitry in response to said detection of disconnection. A DC blocking capacitor may be situated between the device microphone contact and the input circuitry. In some embodiments there may an input switch located between the DC blocking capacitor and the input circuitry, which operates in response to said detection of disconnection. The input switch may be located between a resistor and the input circuitry. There may additionally be electrostatic discharge protection circuitry connected to an ESD node located between the DC blocking capacitor and the input circuitry, said electrostatic discharge protection circuitry comprising a plurality of diodes connected in series.

The biasing circuitry, second switch and input circuitry may, together with the first switch, form at least part of an integrated circuit.

In some embodiments there may be one or more resistors connected in said biasing path, such as two or more two or more resistors connected in series. The capacitor node may be located between two resistors connected in series. The first switch may be located between two of said two or more resistors connected in series or may be located between the resistors and the device microphone contact.

In some embodiments there may be a third switch in parallel with the capacitor for connecting said capacitor node to said reference voltage node. The third switch may be controlled by the control circuitry, and operated to connect the capacitor node to the reference voltage node in response to said detection of disconnection.

The biasing circuitry may generate bias at the bias node with respect to the voltage at a ground contact of said device connector. The reference voltage node may be connected to said ground contact of said device connector.

The device connector may comprise a socket for receiving a jack plug peripheral connector and the detection circuitry may comprise a jack plug detection circuitry for detecting when a jack plug is fully connected into said socket. The detection circuitry may be configured to monitor the electrical properties of at least one contact of the device connector to detect said disconnection, for example the electrical properties of the device microphone contact. In some embodiments the detection circuitry may comprise a mechanical detection switch for detecting whether the removable peripheral apparatus is fully connected.

The host device may further comprise: an alternative bias path for supplying an electrical bias to an alternative device contact of said device connector; and a microphone detect circuit for detecting, on connection of the device connector and the peripheral connector whether an external microphone is connected to said device microphone contact or said alternative device contact; wherein the host device is operable so that, in use, said biasing path or said alternative bias path can be selectively enabled. The biasing path may comprise a first path section and a second path section wherein said first path section is shared with the alternative bias path and the second path section is not shared with the alternative bias path wherein said first switch is located in the second path section and is operated to disable the biasing path when the alternative bias path is selectively enabled. When the alternative bias path is selectively enabled the device microphone contact may be connected to ground. The alternative bias path may comprise a fourth switch for disabling the alternative bias path and the control circuitry may be configured to control the fourth switch to disable the alternative bias path in response to detection of disconnection of the peripheral connector and device connector.

The device connector may be a socket for receiving a jack plug peripheral connector, such as a 3.5 mm jack plug peripheral connector. The device connector may be configured to receive a peripheral connector having at least three poles arranged in a tip-ring-sleeve (TRS) arrangement or at least four poles arranged in a tip-ring-ring-sleeve (TRRS) arrangement.

The host device may be at least one of: a portable computing device; a laptop computer; a personal data assistant; a personal media player; an mp3 player; a portable television; a mobile communications device; a mobile telephone; a navigation aid; a GPS device; a game console; a tablet computer. The host device may be operable with a removable peripheral apparatus which comprises a headset.

In another aspect of the invention there is provided a method of operating a host device connected to a removable peripheral apparatus having a microphone via a device connector forming a mating connection with a respective peripheral connector of the removable peripheral device, the method comprising: supplying bias to a device microphone contact of the device connector via a biasing path, wherein a capacitor is connected between a capacitor node of the biasing path and a reference voltage; detecting disconnection of the peripheral connector and the device connector; and operating a first switch to disable the biasing path in response to said detection of disconnections; wherein said first switch is located in the biasing path between the capacitor node and the device microphone contact.

The method may be implemented in any of the embodiments described above with reference to the first aspect of the invention. In particular the method may further comprise: operating a second switch to connect said device microphone contact to the reference voltage node, in response to said detection of disconnection.

Embodiments of the present invention also relate to the biasing arrangement itself. Thus in another aspect of the invention there is provided a circuit for biasing a microphone, comprising: a microphone connector node for, in use, connecting to a microphone contact, a biasing path for, in use, supplying an electric bias to said microphone connector node, a first switch located in the biasing path; control circuitry, wherein said control circuitry is configured to control the first switch in use to disconnect the microphone connector node from the biasing path in response to a detection that a microphone contact is disconnected from said microphone connector node.

As mentioned the first switch may form part of an integrated circuit with the biasing circuitry. Thus in a further aspect of the invention there is provided an integrated circuit comprising: microphone biasing circuitry for outputting a biasing signal at a first terminal; a second terminal, for, in use, receiving said biasing signal via an external RC network, a third terminal, for, in use, outputting said biasing signal to a external microphone contact, a switch operable to connect said second terminal to said third terminal, switch control circuitry for operating said switch to disconnect said second and third terminals in response to a detection that a microphone contact is electrically disconnected from said third terminal.

In general embodiments of the invention provide a bias reducing circuit, comprising, a connector for connecting an external microphone, said connector having a device microphone contact; and switching circuitry for isolating the device microphone contact from any source of bias, wherein said switching circuitry operates in response to said external microphone being electrically disconnected from said microphone contact.

The bias reducing circuit may further comprising detection circuitry for detecting whether an external microphone is electrically connected to said microphone contact.

BRIEF DESCRIPTION OF THE DRAWINGS

The invention will now be described by way of example only with respect to the following drawings, of which.

DETAILED DESCRIPTION OF THE PREFERRED EMBODIMENTS

Figure 1A:
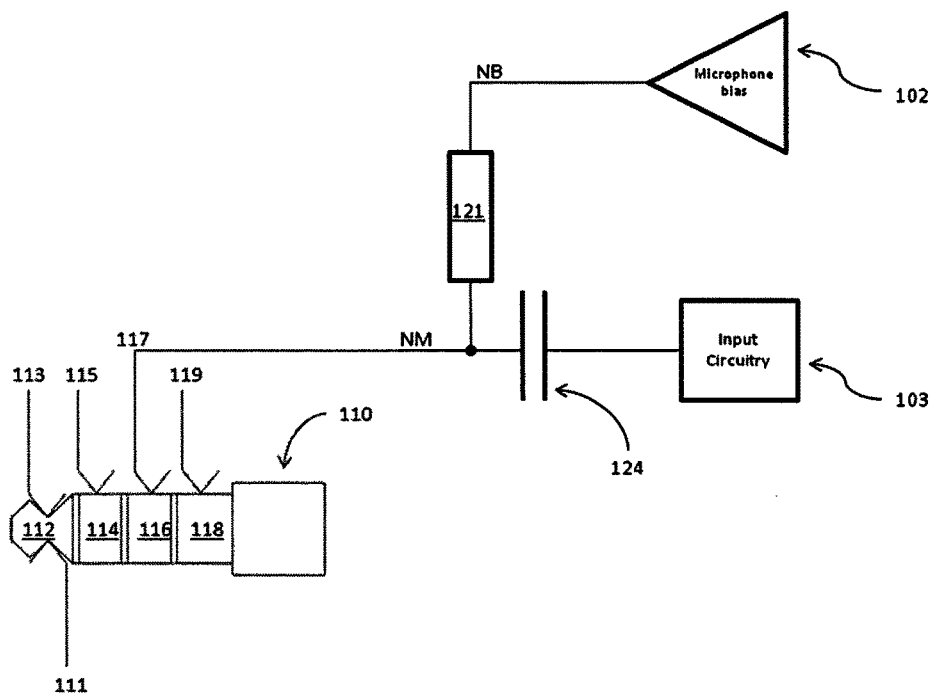
FIGS. 1a and 1b illustrates a typical biasing circuitry and jack plug arrangement, with different positions of the jack plug illustrated.

As mentioned above, a host device for use with a removable peripheral apparatus may have a device connector capable of forming a mating connection with a respective peripheral connector of the removable peripheral apparatus, for instance a plug and socket connector arrangement, and when the device connector and peripheral connector are fully connected a device microphone contact (of the device connector) may be electrically connected to a corresponding microphone contact of the peripheral connector. An electrical bias is supplied to the device microphone contact of such a device connector and, upon separation of the connectors, the microphone bias may be applied to the speakers of the peripheral apparatus during disconnection, leading to undesired audio effects.

In embodiments of the present invention a switch is used to disable the biasing path to the device microphone contact upon detection that the peripheral connector is in the process of being disconnected from the device connector, e.g. the plug is being removed from the socket. In embodiments of the invention a biasing path is arranged to supply an electrical bias, by means of a current source or voltage source, to the device microphone contact, i.e. the device contact to which a peripheral microphone contact of a removable peripheral apparatus may be electrically connected in use, and a first switch is located in this biasing path. A capacitor is coupled between a capacitor node (which is located in the biasing path) and a reference voltage. The first switch is located between the capacitor node and the device microphone contact and control circuitry operates the first switch to disable the biasing path in response to detection of disconnection of the peripheral connector and device connector. The circuitry may therefore comprise means for detecting disconnection of the peripheral connector and device connector, such as a jack detect or the like.

The first switch therefore operates to disconnect, i.e. isolate, the device microphone (M) contact (R2) from the source of bias and the charged capacitor (coupled to the capacitor node), thus removing the bias created by those two components from the device microphone contact (R2). Upon the detection of disconnection of the peripheral connector and device connector by any suitable detection circuitry, the first switch is operated, so that the biasing components are disconnected, i.e. isolated, before any other contacts of the peripheral connector of the removable peripheral apparatus make electrical connection with the device microphone contact. In other words the detection circuitry (the means for detecting disconnection of the device and peripheral connectors) detects the onset of disconnection, e.g. partial separation of the device and peripheral connectors, and the first switch is operated at this stage to disable the biasing path before the other contacts of the peripheral connector make any contact with the device microphone contact. Therefore, no unwanted bias from the biasing path will affect the left and right speakers, for example, when jack plug contacts (T, R1) pass over a microphone socket contact (R2), as discussed above in relation to FIGS. 1a, 1b, and 2.

Embodiments of the present invention will be described in relation to a jack plug connector of a removable peripheral apparatus and a corresponding jack socket connector of a host device. However other arrangements of connector are possible as will be understood by one skilled in the art and the problems described above may apply to any type of connector where at least some contacts of the peripheral connector and device connector that do not electrically connect in normal operation may make at least a transient connection during separation of the connectors. The terms 'jack plug', 'jack socket', 'plug', and 'socket' should therefore not be seen as limiting the scope of the present invention and the terms have been used as an example of a device and peripheral connectors throughout this entire document. The embodiments will be described principally in relation to a plug and socket arrangement having four contacts (e.g. for left and right audio, microphone and ground) but in some arrangements a jack plug or socket may comprise more than four, for example nine, contacts. In some embodiments with mono audio there may be only three contacts. Some rings on the plug may comprise separate regions, for example two semi-circular parts. A plug may comprise multiple fingers and a socket multiple apertures. The components referred to as a plug or a socket may each be either a male or female connector.

Figure 1B:
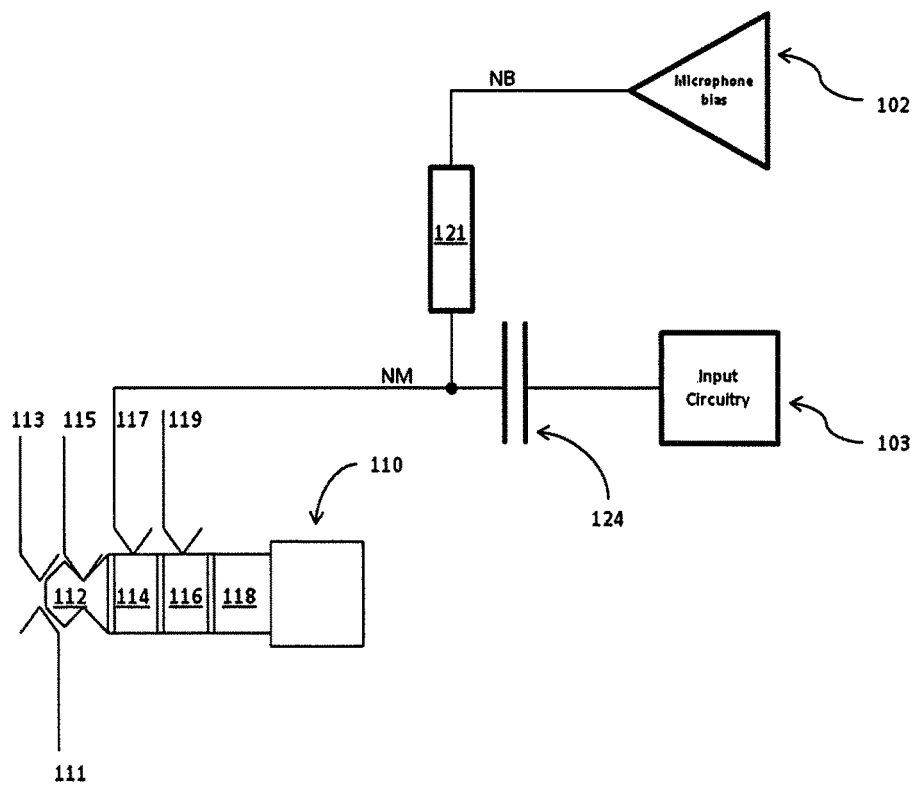
Figure 1C:
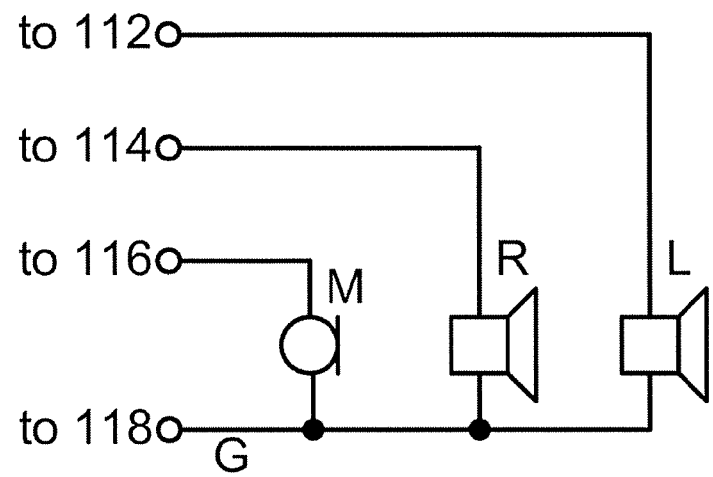
FIG. 1c illustrates one example of the plug connections in a removable peripheral apparatus.
Figure 2:
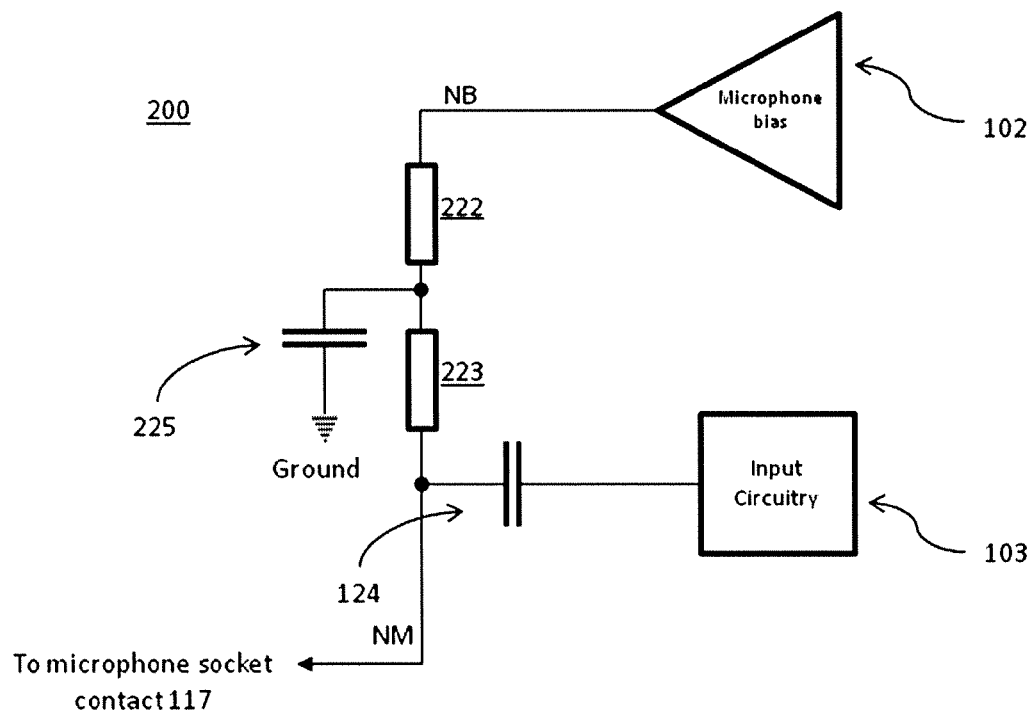
FIG. 2 illustrates another known biasing arrangement.
Figure 3:
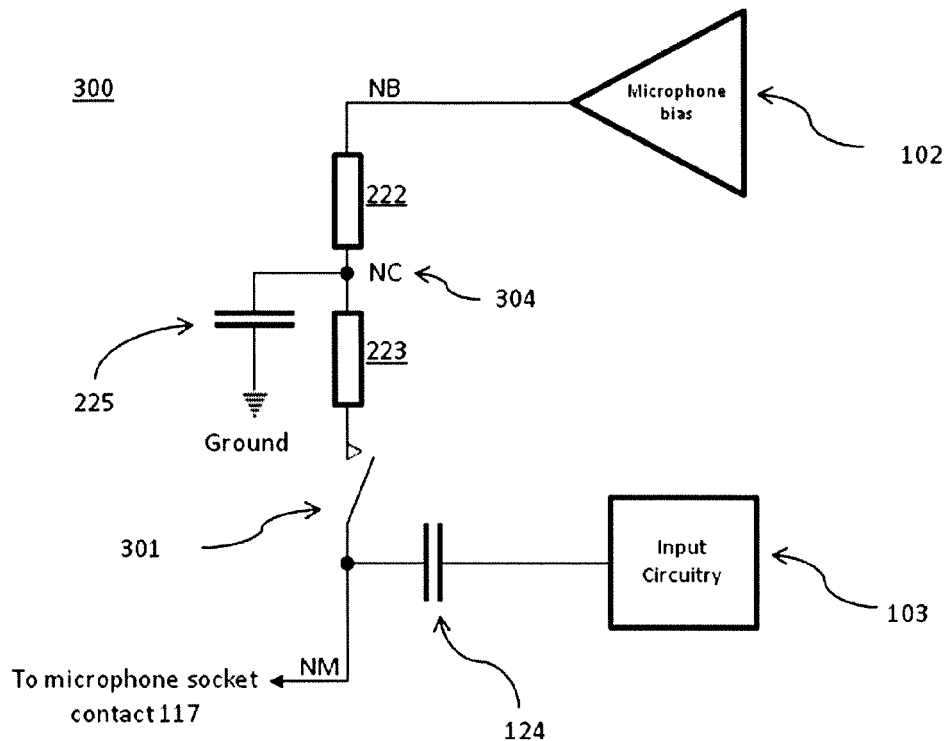
FIG. 3 illustrates a circuit for biasing a microphone according to an embodiment the present invention.

FIG. 3 illustrates a circuit 300 for biasing a microphone of some removable apparatus according to an embodiment of the present invention. Similar components to those of FIGS. 1a, 1b, and 2 are identified using corresponding reference numerals in all subsequent Figures.

The example shown in FIG. 3 shows microphone biasing circuitry 102, which may for example comprise a suitable buffer amplifier powered from a power supply and providing a voltage output based on some reference voltage. The microphone biasing circuitry 102 may comprise other components as would be well known by one skilled in the art, for providing a desired bias for an external microphone. In some embodiments it may be a suitably regulated power supply rail, provided by some external regulation circuitry or even a battery. The biasing circuitry 102 is arranged to provide a bias voltage or current at a bias node NB, which is coupled via a biasing path comprising resistors 222 and 223 and the capacitor node to provide bias to a microphone connector node. The bias node is thus a node of the biasing path, upstream (in the sense of applying a bias) of the capacitor node, at which there is sufficient electrical bias applied to ensure a suitable bias, in use, at a microphone connector node. The microphone connector node is a node which is located in the biasing path at which bias for the external microphone is received. The microphone connector node may be a node which is connected to the device microphone contact of the device connector, such as a microphone socket contact 117 as described above in relation to FIGS. 1a, 1b and 2, or the microphone connector node may comprise the device microphone contact itself. When a removable peripheral apparatus is connected an external microphone may be electrically connected to the microphone connector node, e.g. via a microphone plug contact of a jack plug of the removable apparatus.

In the example of FIG. 3 the microphone connector node (NM) can be seen as the microphone contact in the jack socket, and subsequently will be referred to as a microphone socket contact 117. Similarly the microphone contact on the jack plug which, in use connects to the microphone socket contact 117, will be referred to as a microphone plug contact.

As described above in relation to FIG. 2, resistors 222 and 223 are located in the electrical path between the microphone biasing circuitry 102 and the microphone socket contact 117, i.e. the biasing path (NB to NM), to provide appropriate biasing. Also capacitor 225 is connected between the biasing path and a reference voltage node, in this example a ground node. Capacitor 225 is connected to a capacitor node (NC) 304 in the biasing path between the two resistors 222 and 223 to implement a low pass filter as described above to remove any background noise, e.g. resulting from telecommunication circuitry. As mentioned above capacitor 225 may be a relatively large capacitor in order to implement a suitable filter, for example of the order of several tens of microfarads.

The embodiment shown in FIG. 3 also comprises first switch 301 which is placed in the biasing path, between the capacitor node 304 and the microphone socket contact 117, i.e. between nodes NC and NM. In this particular embodiment, the switch is placed in the biasing path between resistor 223 and the input signal path, i.e. the electrical path, via capacitor 124, by which the input circuitry 103 receives signals from the external microphone from the microphone socket contact.

In use when a jack plug is removed from the socket, which contains microphone socket contact 117, switch 301 is turned off, i.e. opened, thereby disconnecting the capacitor node 304 and thus capacitor 225 from the microphone socket contact 117. In other words the biasing path to the microphone socket contact is disabled i.e. the path from NC to NM is open circuit. Therefore the charge on capacitor 225 is prevented from flowing to the microphone socket contact 117 and creating an unwanted bias and thus audio artefact on removal of the headset.

The switch is controlled by control circuitry, not shown in FIG. 3, which operates in response to detection circuitry providing an indication of the onset of removal of the jack plug from the socket, i.e. that the jack is no longer fully inserted. The detection circuitry may include a mechanically operated switch as known and as described above. Typically such known jack detect arrangements operate (to indicate that a jack plug has been inserted) only when the jack plug is fully inserted into the socket. For instance the mechanical switch may operate only when the tip of the plug is correctly in position.

Such a jack detect arrangement will therefore provide an indication of disconnection as soon as the jack plug is partially removed from the socket. Detecting disconnection of the device and peripheral connectors therefore refers to detecting the onset of separation of the connectors (rather than detecting that the jack plug has been completely removed from the socket). This jack detect signal may be generated as soon as the tip portion of the plug moves from position—which may be before at least some contacts on the plug have been completely disconnected from the relevant contact of the socket.

The skilled person will, of course, appreciate that there are various ways that one could additionally or alternatively detect the onset of removal of the plug from the socket and that the microphone plug contact has been, or is in the process of being, disconnected from the microphone socket contact. Such detection could be optical, mechanical, electrical (inductive, resistive, capacitive) or even magnetic for example. For example microphone detection circuitry may be arranged to monitor the microphone connector node to detect, from the electrical properties of said node, for instance the presented impedance to ground, whether or not the microphone plug contact is electrically connected to the microphone socket contact and thus whether the jack has been partially de-inserted. In other words the electrical disconnection of the microphone socket contact from the microphone plug contact may be directly detected. The electrical properties of other device connector contacts could additionally or alternatively be monitored to detect disconnection.

The first switch is thus operated, following such detection, such that the biasing path is disabled before another plug contact, e.g. one of the speaker contacts on the plug, makes a connection with the microphone socket contact. In other words the bias is removed from the microphone socket contact before the next contact on the plug comes into contact with it. Tests have shown that a period of about 100 μs between detection of disconnection and the first switch being operated is sufficient in most cases. Thus in some embodiments the circuit may be configured so that the time between detecting disconnection of the external microphone and operation of the first switch is of the order of 100 μs or less.

The switch 301 can be thought of as isolating the microphone socket contact 117 from capacitor 225 acting as a source of bias, and thereby not allowing the capacitor to discharge via the microphone socket contact 117 and create an unwanted bias.

The first switch 301 may be any form of switch which is able to disable the biasing path when required without significant impact on the microphone bias when the biasing path is enabled (although clearly the bias supplied to the bias node NB may be supplied taking the presence of the first switch into account to ensure the correct bias at the microphone connector node). In some embodiments the switch could be implemented by more than one switch element. A transmission gate, i.e. a pair of complementary MOS transistors, is one particularly useful switch implementation.

Typically the biasing circuitry 102 and input circuitry 103 are implemented as integrated circuits, and often as part of the same integrated circuit (IC). The capacitor 225 and resistors 222 and 223 are often external to the integrated circuit(s) and coupled thereto. The switch 301 may conveniently be implemented as part of an integrated circuit which includes the biasing circuitry 102 and/or input circuitry 103, but in some embodiments the switch 301 could be implemented as an external component connected in a suitable biasing path between an integrated circuit comprising the biasing circuitry 102 and the microphone socket contact 117.

The circuit 300 also has input circuitry 103, which via an input path including DC blocking capacitor 124, senses the a.c. signal produced by the external microphone at the microphone connector node. It can be seen that in this embodiment the first switch does not form part of the input path and thus might not be expected to have any effect on the a.c. input signal. However the output impedance of the microphone may be of the order of 100Ω, and the value of resistor 223 may be of the order of 1 kΩ, and the on-resistance of switch 301 may be of the order of 100 g. To first order, the microphone output impedance and the extra switch resistance would only give a constant gain error. However, the switch 301 may for example comprise MOS transistors, with gates driven from signal-independent voltages, for example a supply (1.8v), i.e. logic 1, and a ground (0v), i.e. logic 0, while the source and drain voltages may be modulated by the a.c. signal. Thus their gate-source voltages, and hence their on-resistances, will vary with the signal modulation. The consequent variation of the gain modulation will thus introduce distortion. Also these non-linear impedance effects may render the input sensitive to modulated RF signals, which may be demodulated by these non-linearities and produce audio-band interference. Also the switch 301 is directly connected to the microphone socket contact, and may thus suffer ESD events, and thus require either extra area to make adequately rugged or even extra external ESD protection components.

Figure 4:
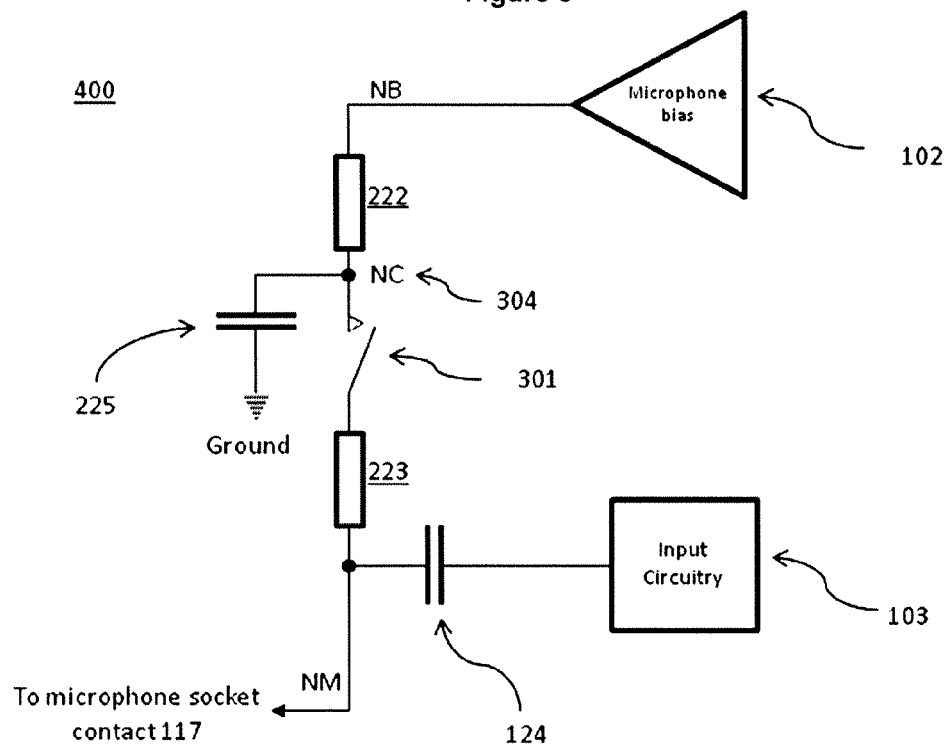
FIG. 4 illustrates a circuit for biasing a microphone according to another embodiment the present invention.

FIG. 4 illustrates an alternative position for a switch 301, which would still operate in the same fashion and disconnect the capacitor node 304 from the microphone socket contact 117, in response to a jack plug being removed from the socket.

FIG. 4 shows that the switch 301 may be placed between the resistor 223 and the capacitor node CN 304. In this position, when the switch 301 is turned off, i.e. is opened, the capacitor 225 will be isolated, i.e. disconnected, from the microphone socket contact 117. This arrangement may be preferred to that shown in FIG. 3 because the switch poles, i.e. the source and drain of constituent MOS switches, will now be held at a substantially constant voltage due to the filtering effect of capacitor 225, and thus show much better linearity. Thus any signal distortion or RF demodulation problems are greatly mitigated. Also there is now a resistive impedance of 1 kΩ or so between the ESD-prone socket contact and the MOS switches which may provide adequate protection without the cost of extra precautions. Thus locating the switch between resistors 222 and 223 may mitigate or avoid the aforementioned possible problems.

As an alternative switch 301 could be positioned so that it forms part of the biasing path and also part of the input path, as will be described in more detail later in relation to FIG. 7.

Figure 5A:
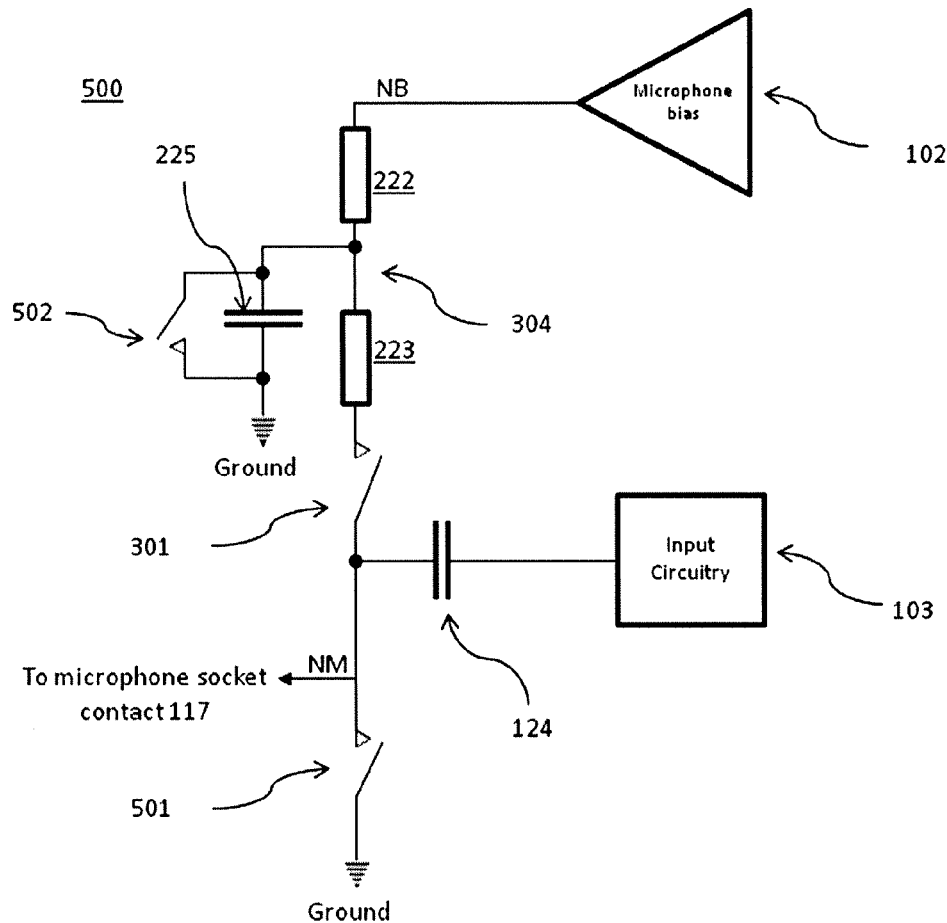
FIG. 5a illustrates a further embodiment of the invention including a switch for connecting a microphone socket contact to ground.

FIG. 5a shows a further embodiment in which in addition to the first switch 301 there is second switch 501 for connecting the microphone connector node (NM), i.e. the microphone socket contact 117, to a ground node. The second switch 501 is controlled by the control circuitry and is turned off, i.e. open, in normal operation when a microphone is electrically connected to the microphone socket contact. The second switch 501 is turned on, i.e. closed, when the onset of removal of the jack plug from the socket is detected. The second switch 501, when closed, clamps the microphone socket contact 117 to a ground node and thereby reduces the unwanted bias at that point.

The second switch 501 prevents the voltage of the microphone socket contact 117 from floating, and by providing a defined reference voltage (i.e. ground) will ultimately stabilise the bias of the microphone socket contact 117 at the defined reference voltage. Given the first switch 301 disconnects the biasing circuitry 102 and the relatively large capacitor 225 from the microphone socket contact 117, the voltage at this node can be rapidly driven to ground.

Thus the second switch 501 may prevent any leakage currents appearing on the microphone socket contact and passing though say a speaker during jack disconnect, and may also discharge any parasitic capacitance coupled to the microphone socket contact through itself rather than through a speaker. More importantly it may also suitably discharge the DC blocking capacitor 124 in implementations such as shown in FIGS. 3 and 4 in which switch 301 is in the bias path between the capacitor node 304 and the blocking capacitor 124, i.e. where operation of switch 301 does not disconnect the d.c. block capacitor 124 from the microphone socket contact.

FIG. 5a also shows an optional third switch 502 which is connected in parallel with the capacitor 225, i.e. between the capacitor node 304 and the reference voltage (ground in this instance). This third switch 502 can be used to discharge the capacitor 225, in response to the detection of disconnection of the jack plug. The switch 502 is turned on, i.e. closed, to provide a route to ground for the charge on the capacitor 225. To fully discharge the capacitor 225 within say 100 μs would require a switch of low enough resistance and robust enough to carry a peak current of the order of one ampere, and capable of absorbing the energy stored in the capacitor and a low enough on-resistance. This is uneconomic for most applications due to the silicon area required for a low Rds-on MOS switch. However, in conjunction with the switches as described, it may be desirable to allow a controlled discharge of the capacitor, say limited by a resistance in series with any switch, for example on system power-down.

It will therefore be clear that the second and third switches may both be present in addition to the first switch but in some embodiments the second switch may be present but not the third switch or the third switch may be present without the second switch. Note that if the biasing circuitry 102 was disabled and the second and third switches could together quickly discharge the capacitor 225 and clamp the microphone connector node to ground the first switch may not be required. However as mentioned this would practically require a very robust and low resistance second switch and so the presence of the first switch to disable the biasing path is preferred in most applications.

Figure 5B:
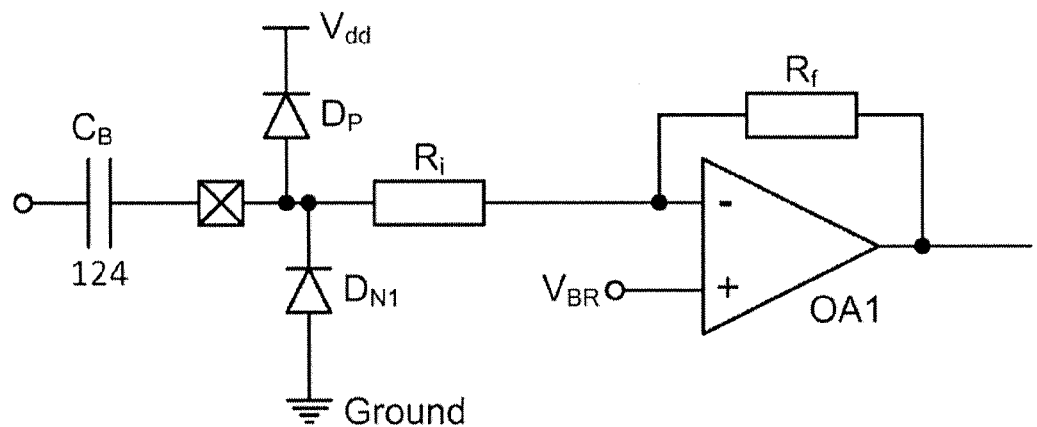
FIG. 5b illustrates a one arrangement for microphone input circuitry.

FIG. 5b illustrates a common microphone input amplifier configuration. Op amp OA1, feedback resistor $R_f$ and input resistor $R_i$ constitute a standard op amp inverting amplifier configuration with gain $-R_f/R_i$. A suitable reference voltage $V_{BR}$ (typically chosen to be half the supply voltage in order to maximise the output signal swing) is applied to the non-inverting input (+) of the op amp, establishing the inverting input (−) at the same voltage and, since there is no d.c. current through $R_i$, also establishing the right-hand side of the blocking capacitor $C_B$ 124 at voltage $V_{BR}$. The other plate of capacitor $C_B$ 124 will be biased by the quiescent output voltage of the microphone to a voltage $V_M$, which may be smaller or greater than $V_{BR}$ depending on the characteristics of the microphone and the choice of $V_{BR}$. For thermal noise reasons, inter alia, resistor $R_i$ will typically be of the order of 1 kΩ to 10 kΩ, so in order to pass low-frequency audio signal components, capacitor $C_B$ may be of the order of 1 μF. Also shown are diodes $D_P$ and $D_N$ to supply and ground respectively, which are required for ESD and possibly latch-up protection.

While the jack is being disconnected, even after switch 301 isolates the bias source and capacitor 225 from the microphone socket contact, capacitor $C_B$ remains connected to the microphone socket contact. The right hand side of $C_B$ will still be pulled to $V_{BR}$ via $R_i$ by the op amp feedback, so the left hand side will initially be at $V_M$. In the absence of second switch 501, this node may be discharged to ground by paths through the speakers as described above as the jack contacts slide past the socket contacts. If switch 501 is present and is activated during jack de-insert, switch 501 will take most of the discharge current and mitigate this effect.

However, even with switch 501, there are still two issues. Firstly, since the op amp end of $R_i$ is held at $V_{BR}$, say 1V, and the switch 501 will have a non-zero on resistance $R_{501}$, say 10Ω versus a value of say 1 kΩ for $R_i$, then there will still be a voltage of about $V_{BR}*R_{501}/(R_{501}+R_i)=10$ mV appearing across switch 501 and hence between the microphone socket contact and ground.

Also, some microphones are designed to operate with a bias voltage of say 2.5V. With $V_{BR}=1$V this implies a voltage of 1.5V across $C_B$. If the left hand side of $C_B$ is suddenly pulled down to 0V by switch 501, the right hand side will attempt to jump down to −1.5V. However the ESD diode $D_N$ will then forward bias, and will actually clamp the right-hand side of $C_B$ to about −0.6V. Thus the current will be limited only by the resistance of switch 501 and the low resistance of the ESD diode, giving a much larger voltage spike on the microphone socket contact until switch 501 discharges $C_B$ to at least the level necessary to substantially turn off the ESD diode.

Figure 5C:
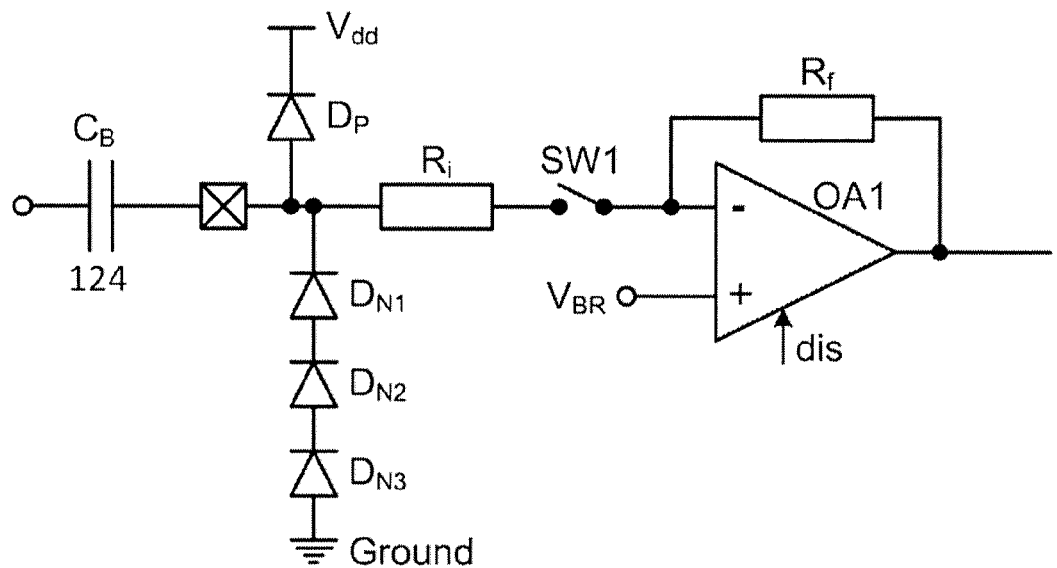
FIG. 5c illustrates an embodiment of microphone input circuitry according to an embodiment of the present invention.

FIG. 5c illustrates two circuit improvements to mitigate these effects.

Switch SW1 is added into the path between the blocking capacitor $C_B$ 124 and the source of bias presented by the amplifier, in this case the inverting op amp input (−) or virtual earth. If this switch SW1 is opened during jack withdrawal, and switch 501 is activated, then switch 501 no longer discharges $C_B$ in series with $R_i$. Neglecting any parasitic capacitances or leakage paths, it will essentially drive into an open circuit and will pull down the left hand plate of $C_B$ immediately.

Figure 5D:
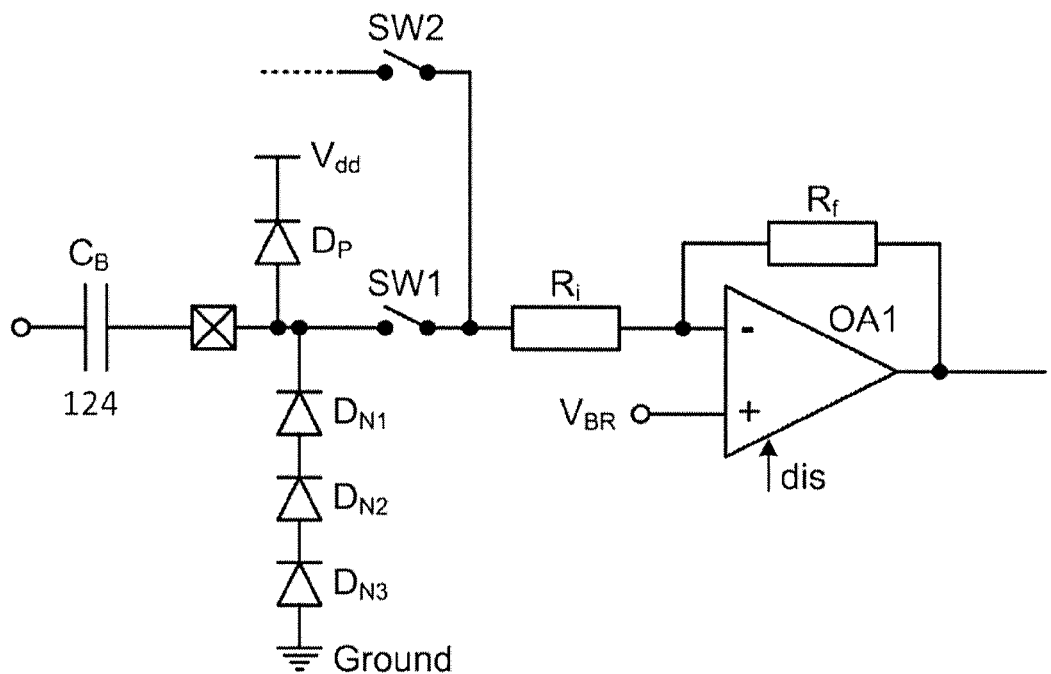
FIG. 5d illustrates an alternative embodiment of microphone input circuitry.

Note SW1 is shown on the right hand side of $R_i$. If on the left hand side as illustrated in FIG. 5*d*, it would still isolate $C_B$ from the source of bias. However for reasons of ESD ruggedness, distortion, and RFI demodulation it is generally preferable to place SW1 on the other side of R, than the IC terminal pad and on a node whose voltage does not vary with signal. However if there are multiple microphones or inputs, and it is desired to use the same $R_i$ for each to save component count or chip area, then the pad side of the resistor may be preferable as shown in FIG. 5*d* as there may be additional switches (e.g. SW2 for different input paths).

Depending on the architecture of the input amplifier, any switch isolating the non-microphone plate of blocking capacitor $C_B$ 124 from a source of bias may be in a different position in the circuit in question.

Also the single ESD diode $D_N$ to ground may be replaced by a plurality of diodes ($D_1$–$D_3$) in series as shown in FIGS. 5*c* and 5*d*. If, for example, there are three diodes in series, then no appreciable current would flow until at least 3×0.6V=1.8V, so there would be negligible current in the above example of a negative 1.5V kick on this node. Depending on the microphone and circuit requirements and specifications and the diode characteristics, there may be only two or possibly more than three diodes in the low-side ESD stack.

To save power, the input amplifier may be powered-down when there is no microphone attached. This may be by means of a control signal applied to a control input of the amplifier as illustrated in FIG. 5*c* or FIG. 5*d*.

Figure 6A:
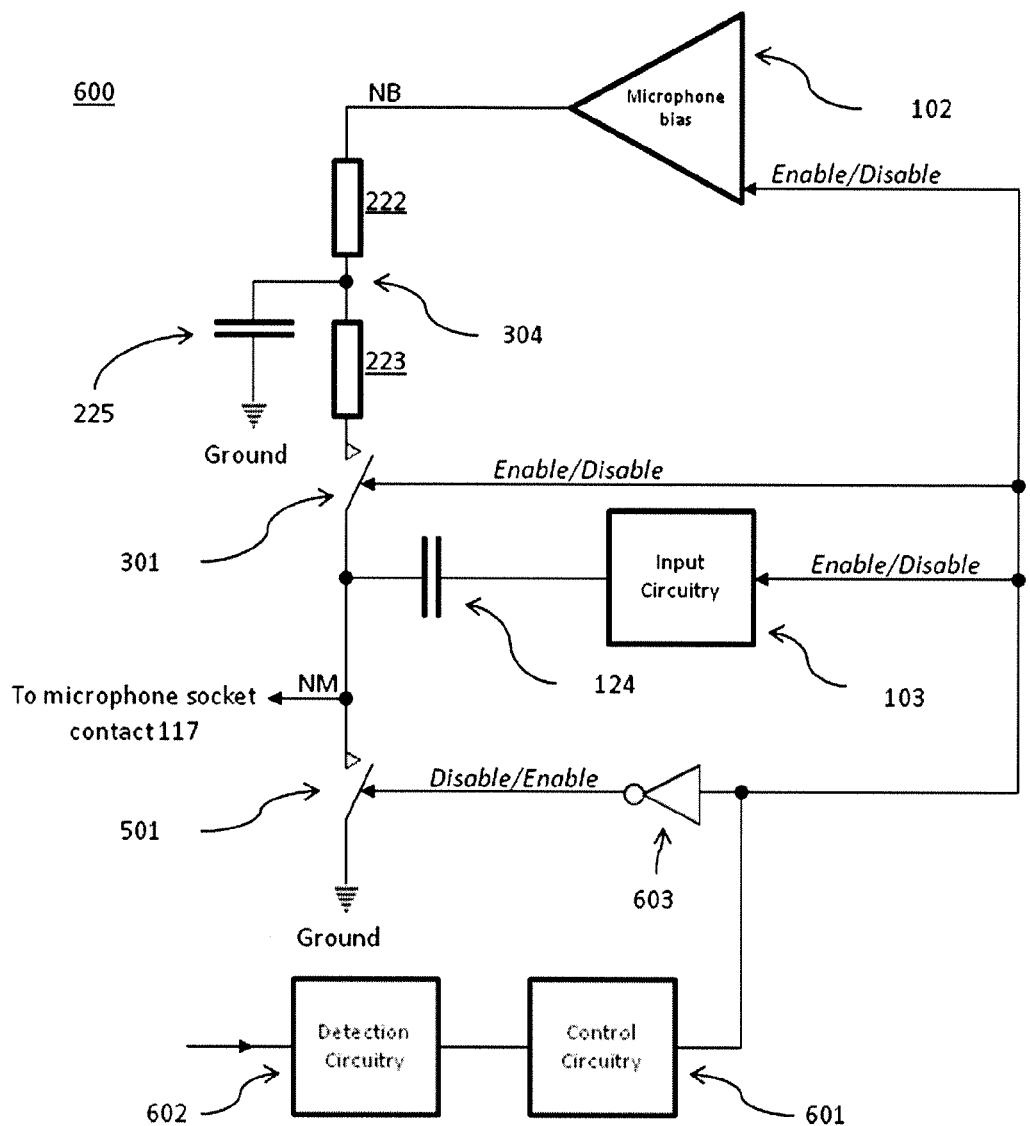
FIG. 6a illustrates an embodiment where the microphone biasing circuitry and input circuitry may be disabled.

FIG. 6*a* illustrates an embodiment of the present invention whereby to further reduce the unwanted power consumption in the circuit the microphone biasing circuitry 102 is disabled, e.g. becomes a high impedance output, by the control circuitry 601 in response to the detection circuitry 602. The detection circuitry detects disconnection of device and peripheral connectors, i.e. in effect, when the jack plug is being removed from the socket and hence when switches 301 and 501 should be operated. There are various ways in which the detection circuitry may operate as briefly disclosed above. For instance the detection circuitry 602 may monitor a signal from the jack plug detect contact 111 and generate a detection signal when the plug is moved, at least partly from the fully inserted position, i.e. mechanically parted. Alternatively the detection circuitry 602 may monitor the electrical properties of the microphone socket contact to determine when a connection with the microphone plug contact is broken and then generate a detection signal. The detection signal could be in the form of a logic signal operated and/or generated by a mechanical switch. This detection signal is received by the control circuitry which generates suitable control signals for disabling the microphone biasing circuitry 102 and input circuitry 103, as well as opening switches 301 and closing switch 501.

This control signal may be generated by a command on the user interface and/or by action by some master controller or applications processor in the device hosting this circuitry. Preferably the control signal may be derived from or be identical to the control signal which controls switches 301 and/or 510. These control signals may be generated by straightforward logic or buffering from the jack-detect signal, or may be modified by software-driven or hard-wired processing in the same integrated circuit as the input amplifier and/or microphone bias, or in another integrated circuit in the host device, for example an applications processor or similar.

Microphone biasing circuitry 102, input circuitry 103 and switch 301 are all thus enabled in normal use with a microphone connected and are disabled upon detection of disconnection of the device and peripheral connectors. The same control signal, which may for example be a 1-bit control signal, may therefore be supplied to all these components. Switch 501 has the opposite operation and thus is only enabled when the onset of removal of the jack plug is detected. Inverter 603 may be included to invert the 1-bit digital signal for switch 501.

The discussion above of the various embodiments has assumed for simplicity that the various components connected to ground nodes will all be the same voltage. However in practice the socket, i.e. the device connector, may be some distance away from at least some of the other circuitry, e.g. the biasing amplifier 102. Thus there may be a non-negligible impedance between a ground node near the socket and a ground node near or inside an integrated circuit comprising some of the circuitry. Any ground return current flowing across the board, for example as a result of the pulsed supply current for TDMA RF circuitry, or return current from the speakers, may introduce a d.c. offset and a.c. ripple in the voltage at one ground relative to another.

Figure 6B:
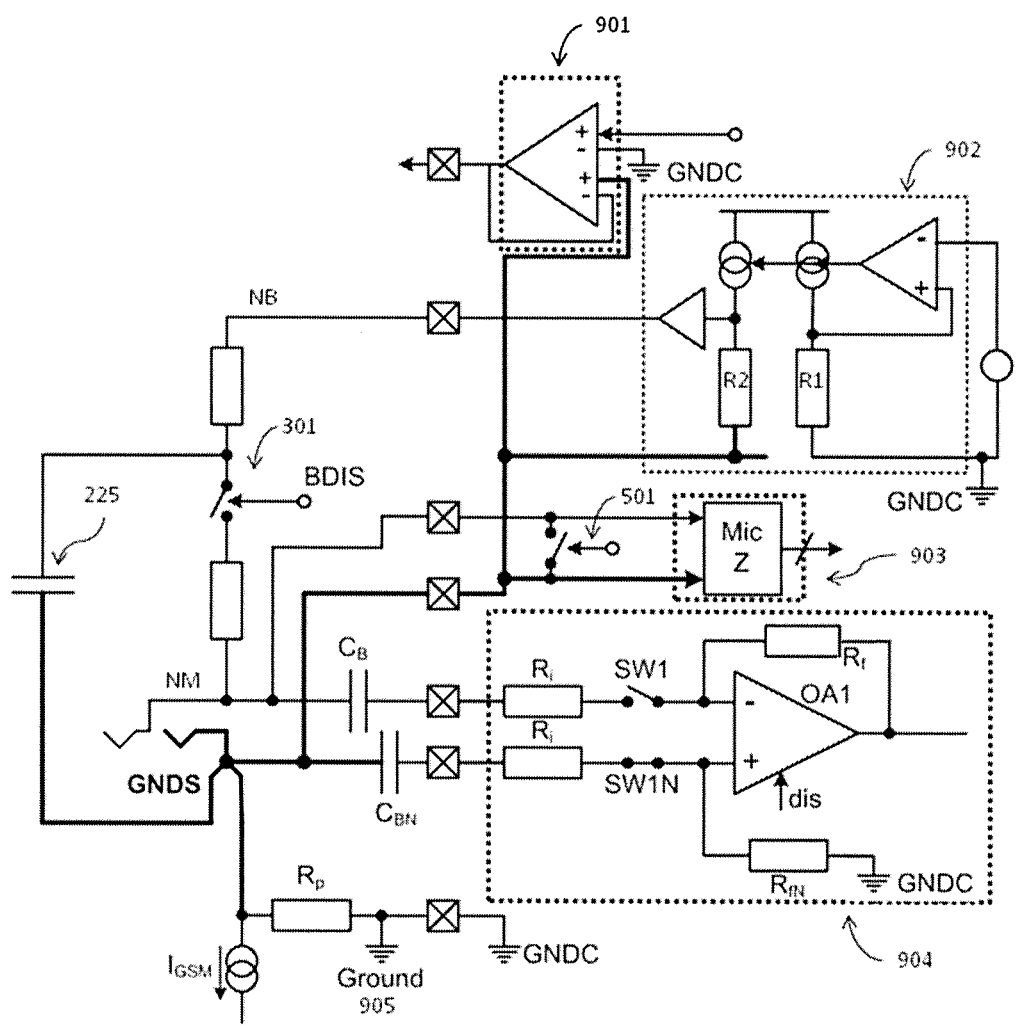
FIG. 6b illustrates another embodiment of the present invention highlighting the connections to ground.

FIG. 6*b* illustrates various aspects of the invention intended to mitigate the consequences of such effects.

Consider ground node 905 to be the true ground for the system. This true ground node 905 is connected via an IC terminal pad to the on-chip ground GNDC (assuming for now there is little resistance or current in this connection). Ground node 905 is also connected via some parasitic ground plane resistance $R_p$ to a ground node GNDS close to the socket. Any ground return current, for example the current $I_{GSM}$ illustrated, perhaps the 217 Hz pulsed ground return current from a TDMA RF amplifier, flowing to the ground node 905 will induce a voltage drop across $R_p$, and hence on node GNDS.

To avoid voltage ripple on the socket ground node GNDS from corrupting the microphone output signal, the microphone input amplifier 904 may be modified to be differential or pseudo differential as illustrated. The voltage at the socket ground node GNDS may also be brought on-chip without passing through a blocking capacitor to allow microphone impedance measurement functions 903.

Also this on-chip connection to the socket ground node GNDS may be used to correct any voltage appearing at this node which is due to the return through this ground node of current driven through the speakers by speaker drive amplifier 901 (the speaker contacts are omitted in FIG. 6*b* for clarity).

This arrangement has two particular advantages. First, when closed switch 501 connects to the socket ground node GNDS rather than local on chip ground node GNDC, to avoid a voltage difference between the clamped microphone socket contact and the locally grounded ground socket contact. Second, as illustrated, the microphone bias may be generated by bias generation circuitry 902 with respect to the socket ground node GNDS, rather than the on chip ground node GNDC. (In this example, a bias reference voltage Vref, defined with respect to the on-chip ground GNDC, generates a current through resistor R1 equal to Vref/R1, which is then mirrored and passed though resistor R2 to generate a voltage equal to R2.(Vref/R1), which is then buffered onto node NB). This avoids capacitor 225 having to fight against a GNDC-referenced microphone bias via resistor 222 in normal operation. A reduced size of capacitor 225 may thus be possible.

Note as illustrated, switch 301 may be off-chip and the control signal BDIS for switch 301 may be generated on chip and transmitted via a suitable contact, or generated elsewhere, e.g. by an apps processor of the host device based on jack detect signal as described above or as generated elsewhere.

Figure 7:
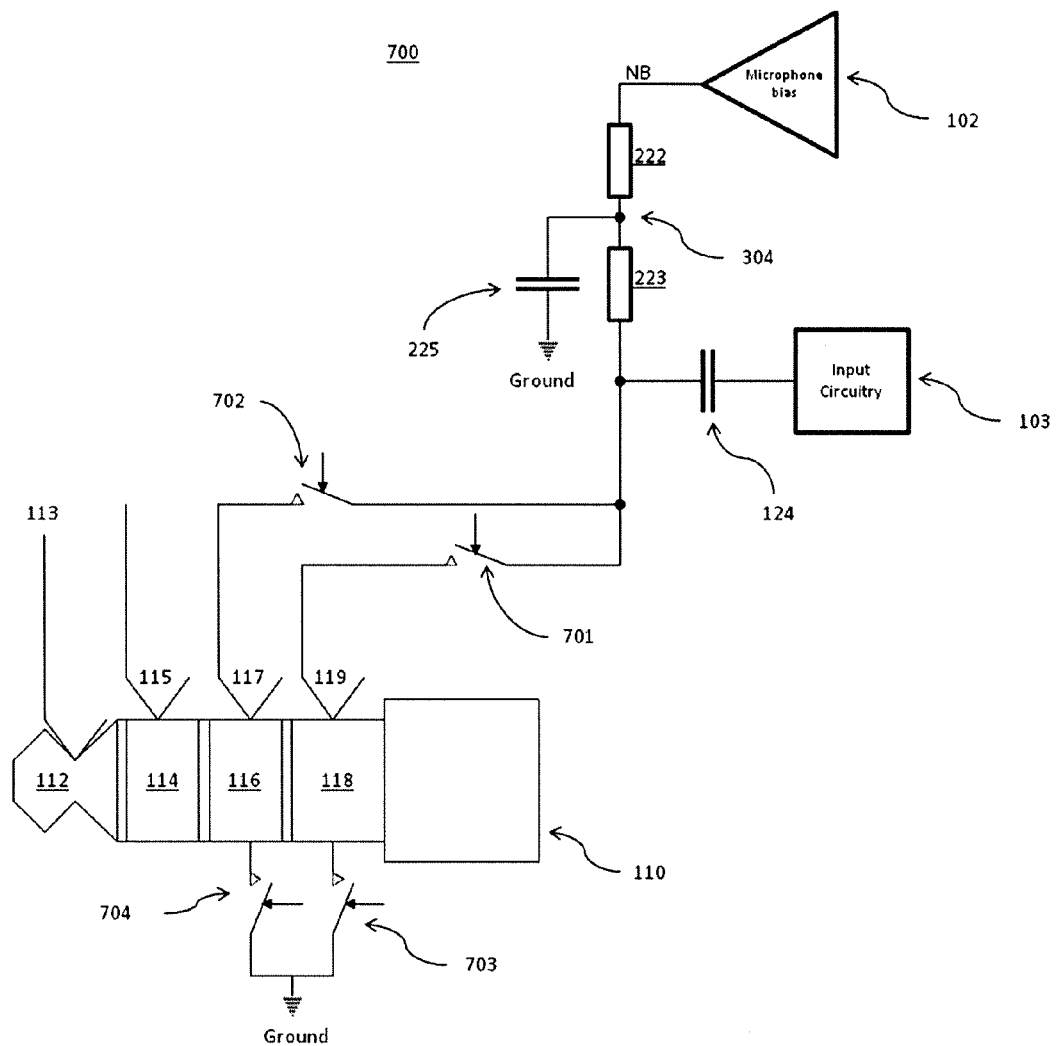
FIG. 7 illustrates an embodiment operable with jack plug having different configurations.

FIG. 7 shows a further embodiment of the present invention wherein the circuit is operable so that either of two socket contacts (i.e. any of two device connector contacts) can be selectively biased by the biasing circuitry, with the other socket contact being connected to ground. This can allow the biasing circuitry to be used with removable peripheral apparatus having different arrangements of the plug contact used for microphone (M) and ground (G).

In the example illustrated in FIG. 7 the circuit could operate correctly with a first jack plug arrangement, having jack plug R2 contact 116 for the microphone (M) and jack plug S contact 118 for ground (G), or a second jack plug arrangement, having a jack plug R2 contact 116 for ground (G) and jack plug S contact 118 for the microphone (M).

Microphone detect circuitry (not shown) can determine, on insertion of a jack plug, which of jack plug contacts 116 and 118 is connected to the microphone. The control circuitry will then control switches 701, 702, 703 and 704 to connect the correct jack socket contacts to the biasing circuitry and to ground accordingly. If the external microphone is connected to plug R2 contact 116 then switch 702 will turn on, i.e. close, and jack R2 contact 116 will be connected via socket R2 contact 117 to the microphone biasing circuitry. This would mean that the ground contact (G) of the jack plug is the S (sleeve) contact 118 and switch 703 would be turned on, i.e. closed, in order to connect the S contact 118 to ground. Both switches 701 and 704 would be held off, i.e. open.

If the external microphone was connected to jack S contact 118 the switch 701 would turn on, i.e. close, and connect the S contact 118 to the microphone biasing circuitry and switch 704 would turn on, i.e. close and connect R2 contact 116 to ground. Both switches 702 and 703 would be held off, i.e. open.

On insertion of a jack plug the detection circuitry thus determines the configuration of the microphone and ground plug contacts and configures the biasing circuit 700 accordingly. Detection circuitry then continues to monitor whether the jack plug remains inserted as described above and, on detection of the onset of removal of the jack plug the relevant one of either switches 701 and 702 (i.e. whichever was closed) is opened to disable to biasing path. At the same time the relevant one of switches 703 and 704 (i.e. whichever was open) may be closed to connect the relevant socket contact to ground. In effect, on detection of removal of the jack plug, both switches 701 and 702 will be open and both switches 703 and 704 will be closed.

In this embodiment the switches 701 and 702 are thus provided not only to enable a desired biasing path when required, but also to disable said path on detection that the jack plug is not fully inserted in the socket.

It will be noted that in the embodiment shown in FIG. 7 the same biasing circuitry 102, via the RC network formed by capacitor 225 and resistors 222 and 223, is used for biasing either socket contact 117 or 119.

It will be noted that in this configuration, the switch used to disable the biasing path (whichever biasing path is established) is located between the microphone socket contact 117 and a branch/tap point for the input circuitry. Thus operation of the switch will not only disable the biasing path but also isolate the microphone socket contact from the DC blocking capacitor 124 and thus input circuitry 103. This does however mean that the switch forms part of the input path in normal operation, which may not be desirable in some instances. This arrangement may suffer from RF distortion, and ESD sensitivity issues discussed above, however it may still provide the most appropriate solution in some applications, as in the embodiment shown in FIG. 7 where it is desired to accommodate multiple connector options.

Figure 8:
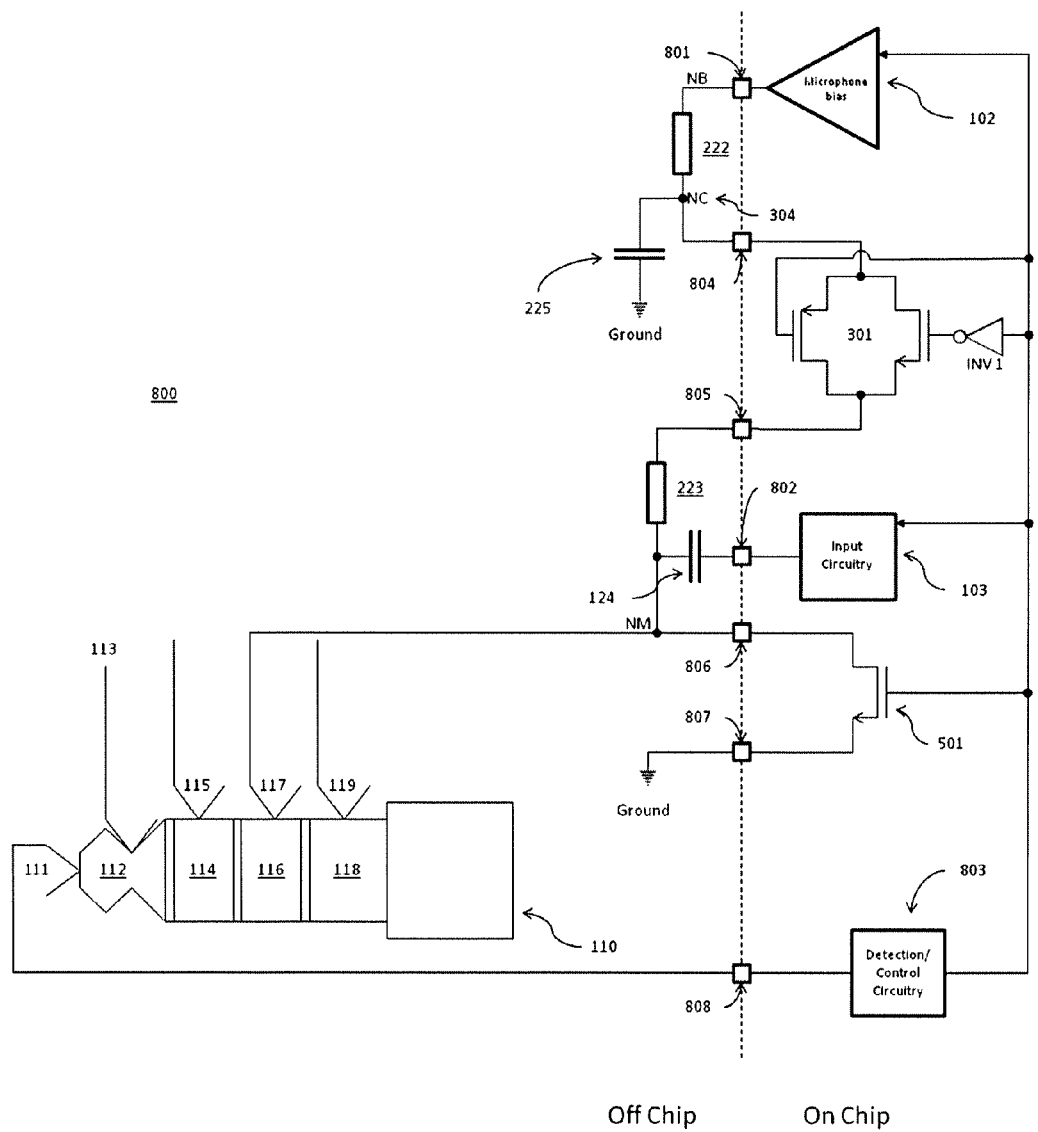
FIG. 8 illustrates an embodiment of the invention implemented as an integrated circuit.

As mentioned above, the biasing circuitry 102 and input circuitry 103 may typically be implemented as an integrated circuit with capacitor 225 and resistors 222 and 223 as external components. As also mentioned it may be beneficial to implement switch 301 as part of the integrated circuit. FIG. 8 illustrates one embodiment of such a configuration. The dotted line marks the divide between the components which are contained within the integrated circuit ('on chip') and those which are not located on the integrated circuit ('off chip'). In FIG. 8 the 'on chip' components are to the right of the dotted line and to the left are the 'off chip' components.

The microphone biasing circuitry 102 and the input circuitry 103 are located 'on chip', these are connected to terminals 801 and 802, respectively. Detection and control circuitry 803 which controls the enable/disable function of the microphone biasing circuitry 102 and the input circuitry 103 is also located 'on chip'.

The first switch 301 is, as mentioned, also located on chip between terminals 804 and 805. The first switch 301 in this example is shown as a transmission gate, which is constructed from parallel connected NMOS and PMOS transistors, with an transmission gate inverter INV 1 inverting the gate drive input to the gate of the NMOS. For the transmission gate switch 301 to turn off/close in response to the jack plug being removed from the jack socket a control signal (from the detection/control circuitry 803) will be inverted by the transmission gate inverter INV 1 which will in turn stop current flowing from the source to drain of the NMOS transistor. Similarly the control signal will inhibit the flow of current through the PMOS transistor and as a result the transmission gate 301 will prevent the flow of current from the terminal 804 to terminal 805.

The embodiment shown in FIG. 8 has the first switch 301 located in the biasing path between resistors 222 and 223 (as illustrated in FIG. 4). Resistor 222 is coupled between terminals 801 (the output for the biasing circuitry 103) and terminal 804. The capacitor 225 is also coupled into the biasing path between these two terminals. The biasing signal output from terminal 801 is thus received back on-chip at terminal 804. As mentioned the first switch 301 is located between terminals 804 and 805 and thus, unless the biasing path is disabled by the first switch 301, the biasing signal received at terminal 804 is thus output at terminal 805. Terminal 805 connects to the microphone socket contact 117 via resistor 223.

Microphone socket contact 117 is also connected to terminal 806, which is connected on chip via second switch 501 to a ground terminal 807.

In this embodiment of the present invention second switch 501 is represented by an NMOS transistor 501 which is controlled directly by a control signal from the detection/control circuit 803. When a jack plug is removed from the jack socket the NMOS transistor 501 will permit current to flow from its drain terminal (806) to its source terminal (807). Therefore if there is any residual current, which could create an unwanted bias, remaining at the microphone socket contact and/or in the surrounding circuitry then it will be directed to ground via the NMOS transistor 501.

Figure 9:
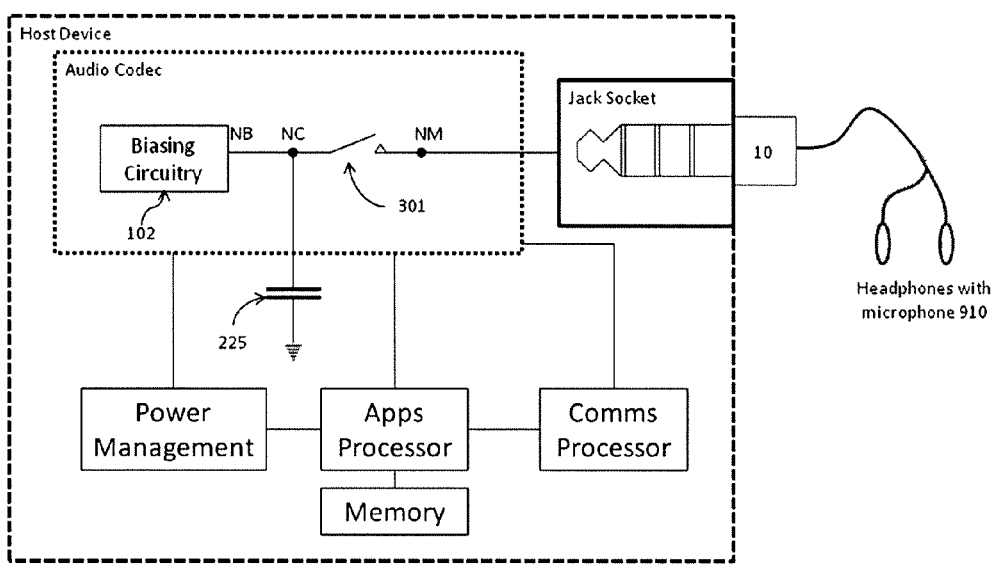
FIG. 9 illustrates a host device according to an embodiment of the invention connecting to a removable peripheral apparatus.

FIG. 9 illustrates a host device according to an embodiment of the present invention showing components of the host device, including the audio processing circuitry as well as the other processing circuitry within the host device. In this embodiment the biasing circuitry 102 and first switch 301 form part of an audio codec (although other arrangements are possible). A removable peripheral device, in this example headphones (with microphone) 910, connects to the host device via the jack plug 10 and jack socket which, in use, is electrically connected to the biasing circuitry 102. Two nodes, capacitor node (NC) and the microphone connector node (NM), can be seen in the biasing path between the jack plug 10 and the biasing circuitry 102. The capacitor 225, which in an embodiment of the present invention, is coupled between the biasing path at capacitor node NC and a reference voltage (which in this figure is shown as ground). This capacitor 225 has a capacitance in the microfarad range, which is used to suppress any noise arising along the biasing path and any other electrical connections which are connected to the biasing path. The most common source of noise, in a communications device, along the biasing path will arise from the RF transmitter.

Embodiments of the invention may be arranged as part of an audio and/or signal processing circuit, for instance an audio circuit which may be provided in a host device. A circuit according to an embodiment of the present invention may be implemented as an integrated circuit and may be implemented in a host device. The term host device is used in this specification to refer to any electronic or electrical device which is removably connectable to an external peripheral apparatus having a microphone where the biasing for such external microphone is generated in the host device. The host device may especially be a portable and/or battery powered host device such as a mobile telephone, an audio player, a video player, a PDA, a mobile computing platform such as a laptop computer or tablet and/or a games device for example. A removable peripheral apparatus is any apparatus which may be connected to and used with a host device and, as used in this application, refers to apparatus having a microphone where a bias for the microphone is supplied by the external device when connected. The peripheral apparatus may for instance be a headset, e.g. a set of headphones, earbuds or the like including a microphone.

It will be appreciated that a jack plug is one example of a removable peripheral device which could suffer from the cross connection of non-corresponding contacts. Any removable peripheral apparatus where the plug contacts are arranged along the direction of insertion and removal has the possibility of being effected by unwanted biases at certain socket contacts and therefore the circuit described above will be useful to mitigate any undesired effects. Furthermore any removable peripheral apparatus where the plug contacts may make contacts with any other socket contact, whether they are arranged in a linear fashion or not, may come under the scope of the present invention. Similarly for the jack socket, any other removable peripheral apparatus socket can be used in conjunction with the present invention.

The term node may be taken to mean any point along an electrical path and does not necessarily imply a terminal, connection point or contact of a connector (although clearly a terminal, connection point or contact may be a node).

The embodiments above have been described in relation to the removal of unwanted bias from microphone circuits. However some other analogue and digital circuits may require the removal of unwanted bias from a contact of a connector to prevent undesired effects on removal of a removable peripheral apparatus, i.e. there may be other applications where a bias on a contact of a device connector making contact with other contacts of a peripheral connector may be undesirable. The principles of the present invention may be readily applied to such other applications.

The skilled person will recognise that at least some aspects of the above-described apparatus and methods may be embodied as processor control code, for example on a non-transitory storage or carrier medium such as a disk, CD- or DVD-ROM, programmed memory such as read only memory (Firmware), or on a data carrier such as an optical or electrical signal carrier. For some applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

What is claimed is:

1. A host device for use with a removable peripheral apparatus having a microphone, the host device comprising:
   a device connector capable of forming a mating connection with a respective peripheral connector of the removable peripheral device, the device connector having a device microphone contact and a device ground contact;
   biasing circuitry for supplying an electrical bias to said device microphone contact via a biasing path;
   a first switch operable to electrically connect said device microphone contact to said device ground contact;
   detection circuitry for detecting disconnection of the peripheral connector and device connector; and
   a controller for controlling said first switch to connect the microphone contact to the device ground contact in response to detection of disconnection of the peripheral connector and device connector.

2. A host device as claimed in claim 1, further comprising a second switch located in the biasing path and operable to disable the biasing path wherein the controller is configured to control the second switch to disable the biasing path in response to said in response to detection of disconnection of the peripheral connector and device connector.

3. A host device as claimed in claim 1 further comprising a separate ground return path between the device ground contact and a ground reference node.

4. A host device as claimed in claim 1 wherein said biasing circuitry and said first switch are formed as part of a first integrated circuit, wherein the first integrated circuit comprises:
- a microphone terminal connected, in use, to said device microphone contact;
- a first ground terminal coupled to a ground reference node to provide an on-chip ground; and
- a second ground terminal coupled, in use, to said device ground contact;
- wherein said first switch is operable to connect said microphone terminal to said second ground terminal.

5. A host device as claimed in claim 4 wherein the biasing circuitry is configured to generate said electrical bias with respect to a voltage at the second ground terminal.

6. A host device as claimed in claim 5 wherein the biasing circuitry is coupled to said first ground terminal and to said second ground terminal.

7. A host device as claimed in claim 6, wherein the biasing circuitry comprises a first circuit branch for generating a first current based on a reference voltage defined with respect to a voltage at the first ground node and a second circuit branch for supplying a second current based on the first current to a resistor coupled to the second ground node.

8. A host device as claimed in claim 4, further comprising input circuitry for receiving a microphone signal from said microphone contact wherein the input circuitry is coupled to said microphone terminal and said second ground terminal.

9. A host device as claimed in claim 8, wherein the input circuitry comprises a differential or pseudo-differential amplifier coupled to said microphone terminal and said second ground terminal.

10. A host device as claimed in claim 8, wherein a DC blocking capacitor is situated between the device microphone contact and said input circuitry.

11. A host device as claimed in claim 10, further comprising an input switch located between the DC blocking capacitor and the input circuitry, which operates in response to said detection of disconnection.

12. A host device as claimed in claim 4, wherein the first integrated circuit further comprises impedance measurement circuitry configured to measure a microphone impedance wherein the impedance measurement circuitry is coupled to said microphone terminal and said second ground terminal.

13. A host device as claimed in claim 4, wherein the signal path between the device ground contact and the second ground terminal does not have a DC blocking capacitor.

14. A host device as claimed in claim 4, wherein the first integrated circuit further comprises a speaker drive amplifier, wherein the speaker drive amplifier is coupled to said first ground terminal and to said second ground terminal.

15. A host device as claimed in any claim 1, wherein the device connector is a socket for receiving a jack plug peripheral connector.

16. A host device for use with a removable peripheral apparatus having a microphone, the host device comprising:
- a device connector capable of forming a mating connection with a respective peripheral connector of the removable peripheral device, the device connector having a device microphone contact and a device ground contact; and
- a first integrated circuit comprising biasing circuitry generating an electrical bias for device microphone contact, the first integrated circuit comprising:
  - a bias terminal for outputting the electrical bias to the device microphone contact;
  - a first ground terminal coupled to a ground reference node to provide an on-chip ground; and
  - a second ground terminal coupled, in use, to said device ground contact;
  - wherein the biasing circuitry is configured to generate said electrical bias with respect to a voltage at the second ground terminal.

17. A host device as claimed in claim 16, further comprising:
- a biasing path between the biasing circuitry and the device microphone contact;
- a biasing path switch operable to disable said bias path;
- detection circuitry for detecting disconnection of the peripheral connector and device connector; and
- a controller for controlling said biasing path switch to disable the biasing path in response to detection of disconnection of the peripheral connector and device connector.

18. A host device as claimed in claim 16, further comprising further comprising
- a microphone terminal connected, in use, to said device microphone contact to receive a microphone signal;
- a first switch operable to connect said microphone terminal to said second ground terminal;
- detection circuitry for detecting disconnection of the peripheral connector and device connector; and
- a controller for controlling said first switch to connect the microphone terminal to the second ground terminal in response to detection of disconnection of the peripheral connector and device connector.

19. An integrated circuit for interfacing with a device connector for connecting to a removable peripheral audio apparatus having a microphone, the integrated circuit comprising:
- biasing circuitry configured to generate an electrical bias at a biasing terminal for biasing said microphone;
- a first ground terminal configured to be coupled, in use, to a ground reference node to provide an on-chip ground;
- input circuitry for receiving an input microphone signal from a microphone terminal;
- a second ground terminal for receiving a voltage from a ground contact of the device connector.

20. An integrated circuit as claimed in claim 19, further comprising a switch operable to disconnect the biasing circuitry from the biasing terminal.

* * * * *

UNITED STATES PATENT AND TRADEMARK OFFICE
CERTIFICATE OF CORRECTION

PATENT NO. : 9,872,103 B2
APPLICATION NO. : 15/591808
DATED : January 16, 2018
INVENTOR(S) : Howlett et al.

It is certified that error appears in the above-identified patent and that said Letters Patent is hereby corrected as shown below:

In the Specification

In Column 10, Line 42, delete "100 g." and insert -- 100Ω. --, therefor.

Signed and Sealed this
Twenty-eighth Day of May, 2019

Andrei Iancu
*Director of the United States Patent and Trademark Office*